United States Patent
Watanabe

[11] Patent Number: 6,104,055
[45] Date of Patent: Aug. 15, 2000

[54] SEMICONDUCTOR DEVICE WITH MEMORY CELL HAVING A STORAGE CAPACITOR WITH A PLURALITY OF CONCENTRIC STORAGE ELECTRODES FORMED IN AN INSULATING LAYER AND FABRICATION METHOD THEREOF

[75] Inventor: Kenji Watanabe, Tokyo, Japan

[73] Assignee: NEC Corporation, Tokyo, Japan

[21] Appl. No.: 08/825,053

[22] Filed: Mar. 27, 1997

[51] Int. Cl.⁷ .................................................. H01L 27/108
[52] U.S. Cl. .......................... 257/309; 257/306; 257/307; 257/308; 257/310; 257/311
[58] Field of Search .................................. 257/306, 307, 257/308, 309, 310, 311

[56] References Cited

U.S. PATENT DOCUMENTS

| | | | |
|---|---|---|---|
| 5,126,280 | 6/1992 | Chan et al. | 257/309 |
| 5,162,881 | 11/1992 | Ohya . | |
| 5,217,914 | 6/1993 | Matsumoto et al. . | |
| 5,247,196 | 9/1993 | Kimura . | |
| 5,262,662 | 11/1993 | Gonzalez et al. | 257/308 |
| 5,274,258 | 12/1993 | Ahn . | |
| 5,389,568 | 2/1995 | Yun . | |
| 5,399,518 | 3/1995 | Sim et al. | 438/396 |
| 5,401,681 | 3/1995 | Dennison . | |
| 5,410,503 | 4/1995 | Anzai | 365/149 |
| 5,418,180 | 5/1995 | Brown . | |
| 5,438,013 | 8/1995 | Kim et al. | 438/396 |
| 5,491,103 | 2/1996 | Ahn et al. . | |
| 5,491,356 | 2/1996 | Dennison et al. | 257/309 |
| 5,508,222 | 4/1996 | Sakao . | |
| 5,539,230 | 7/1996 | Cronin | 257/309 |
| 5,604,696 | 2/1997 | Takaishi . | |

FOREIGN PATENT DOCUMENTS

| | | | |
|---|---|---|---|
| 1-130556 | 5/1989 | Japan . | |
| 1-290255 | 11/1989 | Japan . | |
| 3-167874 | 7/1991 | Japan | 257/306 |
| 4-264767 | 9/1992 | Japan . | |
| 4-318963 | 11/1992 | Japan | 257/306 |
| 6-29482 | 2/1994 | Japan . | |
| 7-29994 | 1/1995 | Japan . | |

*Primary Examiner*—Valencia Martin-Wallace
*Attorney, Agent, or Firm*—Sughrue, Mion, Zinn, Macpeak & Seas, PLLC

[57] ABSTRACT

A semiconductor device with a memory cell having a transfer transistor and a storage capacitor is provided, which is capable of further miniaturization of the storage capacitor. The transistor is formed in an active region of a semiconductor substrate. An insulating layer is formed on the substrate to cover the active region. The insulating layer has a penetrating opening extending to a source/drain region of the transistor. A first cylindrtical electrode is formed in the opening of the insulating layer to be electrically connected to the first source/drain region. A second cylindrtical electrode is formed in the opening of the insulating layer in the inside of the first electrode to be concentric with the first electrode. A dielectric layer is formed on the insulating layer to cover the surface of the first and second electrodes. A third electrode is formed on the dielectric to be opposite to the first and second elecgrodes through the dielectric layer. The first and second electrodes constitute a storage electrode of the storage capacitor, and the third electrode constitutes a plate electrode thereof.

18 Claims, 7 Drawing Sheets

SEMICONDUCTOR DEVICE WITH MEMORY CELL HAVING A STORAGE CAPACITOR WITH A PLURALITY OF CONCENTRIC STORAGE ELECTRODES FORMED IN AN INSULATING LAYER AND FABRICATION METHOD THEREOF

BACKGROUND OF THE INVENTION

1. Field of the Invention

The present invention relates to a semiconductor device and more particularly, to a semiconductor device with a memory cell including a transfer transistor and a storage capacitor of a stacking type, and a fabrication method thereof.

2. Description of the Prior Art

A Dynamic Random Access Memory (DRAM) is capable of randomly reading/writing of the stored data. The DRAM usually has a lot of memory cells each having a transfer transistor and a capacitor, because of its simple structure. This structure of the memory cell has been widely used as it is optimum for higher integration of the cells.

Conventionally, with the DRAM memory cells of this sort, the storage capacitors with various three-dimensional configurations have been developed and actually used with the increasing integration scale of the cells. The purpose of the three-dimensional configurations of the capacitors is as follows:

It is essential for the storage capacitor to decrease the chip area more and more to cope with the increasing integration. To ensure the stability and reliability of the DRAM operation, the capacitor needs to have a specific minimum capacitance or greater. Therefore, it is essential for the lower electrode (i.e., storage electrode) of the capacitor to have a three-dimensional structure, thereby increasing the surface area of the capacitor without increasing the chip area.

The conventional three-dimensional configurations of the storage cell can be divided into two types;, the "stacking type" and the "trench type". These two types have merits and demerits, respectively. However, the three-dimensional configurations of the stacking type have an advantage that the memory cell has a high noise resistance property due to the α-ray and peripheral circuitry, and therefore, it is capable of stable DRAM operation even for the comparatively small capacitance. Accordingly, it has been supposed that the three-dimensional configurations of the stacking type are effectively applicable to the 1-Gbit DRAMs where the design rule of approximately 0.15 μm is applied.

With the storage capacitors of the "stacking type", which are termed the "stacked capacitors", conventionally, a lot of energetic study has been performed for the cylindrical storage capacitors and various improvement has been made therefor. An example of the conventional DRAM memory cells having the stacked capacitor with the cylindrical configuration is shown in FIG. 1, in which the storage electrode is concentrically formed.

In FIG. 1, a field oxide layer 102 is selectively formed on a main surface of a p-type single-crystal silicon substrate 101, defining active regions on the substrate 101. The surface of the substrate 101 is exposed from the field oxide layer 102 in the active regions. For the sake of simplification, only one of the active regions thus defined is shown in FIG. 1

In the active region, a gate electrode 104 is formed over the substrate 101 and a gate oxide layer 103. A pair of $n^+$-type diffusion regions 105 and 106 are formed in the substrate 101 at each side of the gate electrode 104. The pair of diffusion regions 105 and 106, the gate oxide layer 103, and the gate electrode 104 constitute a Metal-Oxide-Semiconductor (MOS) field-Effect Transistor (FET) serving as a transfer transistor of the memory cell. The pair of diffusion regions 105 and 106 serve as a pair of source/drain regions of the MOSFET, respectively.

An interlayer insulating layer 107 is formed to cover the transfer transistor and the field oxide layer 107. A contact hole 107a is formed in the interlayer insulating layer 107 at a location just over the source/drain region 106.

A lower electrode 108 is formed on the interlayer insulating layer 107. The lower electrode 108 is contacted through the contact hole 107a with the underlying source/drain region 106 to be electrically connected to the region 106. The source/drain region 106 serves as a storage node.

A first cylindrical electrode 109, a second cylindrical electrode 110, and a third cylindrical electrode 111 are formed on the lower electrode 108. The first, second, and third cylindrical electrodes 109, 110, and 111 are contacted with and electrically connected to the lower electrode 108, respectively. These three cylindrical electrodes 109, 110, and 111 form a triple-cylindrical configuration. The three cylindrical electrodes 109, 110, and 111 and the lower electrode 108 constitute a storage electrode 112 of the capacitor.

A dielectric layer 113 is formed to cover the storage electrode 112. An upper or plate electrode 114 is formed on the dielectric layer 113.

The storage electrode 112, the dielectric layer 113, and the plate electrode 114 constitute the storage capacitor.

Thus, the conventional DRAM memory cell of FIG. 1 includes the single MOS transfer transistor and the single storage capacitor with the triple-cylindrical configuration.

With the conventional DRAM memory cell of FIG. 1, if the memory cell is further miniaturized for 256-Mbit or 1-Gbit DRAMS, the following problem will occur.

Specifically, in the fabrication process sequence of the conventional DRAM memory cell of FIG. 1, a cleaning process is necessary after the processes of forming the storage electrode 112. During this cleaning process, the cylindrical electrodes 109, 110, and 111 tend to be damaged and/or broken because of the pressure of a flowing liquid cleaner and others. Therefore, the thickness of the cylindrical electrodes 109, 110, and 111 is difficult to be further decreased, unless the satisfactorily large mechanical strength is ensured.

To further decrease the thickness of the cylindrical electrodes 109, 110, and 111 while keeping their mechanical strength at a satisfactory level, it is essential to develop some new material having an excellent step-coverage property and providing a satisfactorily low stress. However, such new material is presently quite difficult to developed. As a result, the multiple-cylindrical configuration has a limit use for further miniaturization.

As described above, since the thickness of the cylindrical electrodes 109, 110, and 111 is difficult to further decrease in the conventional the memory cell of FIG. 1, the height of the storage electrode 112 will be inevitably higher and higher to provide increasing storage capacity to cope with further miniaturization.

However, if the height of the storage electrode 112 is large, the cell array area where the memory cells of the DRAM are regularly arranged tends to have an excessively large step or height difference from the peripheral circuit area where the peripheral circuitry of the DRAM is arranged. This large height difference will cause some problems with the photo lithography process resolution is degraded and breaking and/or short-circuit occurs in interconnecting or wiring metallization.

SUMMARY OF THE INVENTION

Accordingly, an object of the present invention is to provide a semiconductor device with a memory cell having a transfer transistor and a storage capacitor that is capable of further miniaturization of the storage capacitor while keeping the capacitance at an acceptable level or higher, and a fabrication method of the device.

Another object of the present invention is to provide a semiconductor device with a memory cell having a transfer transistor and a storage capacitor that is able to cope with further integration of the memory cells, and a fabrication method of the device.

The objects together with others not specifically mentioned will become clear to those skilled in the art from the following description.

According to a first aspect of the present invention, a semiconductor device with a memory cell having a transfer transistor and a storage capacitor is provided.

An active region is formed in a surface area of a semiconductor substrate. The transfer transistor is formed in the active region. The transistor has first and second source/drain regions formed in the active region.

An insulating layer is formed on the surface area of the substrate to cover the active region. The insulating layer has a penetrating opening extending to the first second source/drain region.

A first cylindrical electrode is formed in the opening of the insulating layer to be electrically connected to the first source/drain region. A second cylindrtical electrode is formed in the opening of the insulating layer in the inside of the first electrode to be concentric with the first electrode.

A dielectric layer is formed on the insulating layer to cover the surface of the first and second electrodes.

A third electrode is formed on the dielectric to be opposite to the first and second elecgrodes through the dielectric layer.

The first and second electrodes constitute a storage electrode of the storage capacitor, and the third electrode constitutes a plate electrode thereof.

With semiconductor device according to the first aspect of the invention, since the first and second electrodes serving as the storage electrode are formed in the opening of the insulating layer, the first and second electrodes are not damaged and/or broken because of the pressure of a flowing liquid cleaner and others during a subsequent cleaning process.

Also, the second cylindrical electrode is formed in the opening of the insulating layer to be concentric with the first electrode. The thickness of the first and second electrodes can be readily reduced. Therefore, the capacitance of the storage capacitor can be designed at an acceptable level or higher even if the miniaturization is further progressed.

Further, the first and second electrodes are formed to be buried in the insulating layer. Therefore, approximately no height difference occurs between the cell array area and the peripheral circuit area. Thus, the problems relating to the resolution in photolithography process and the breaking and/or short-circuit in interconnecting or wiring metallization process can be solved.

As a result, the semiconductor device according to the first aspect is capable of further miniaturization of the storage capacitor while keeping the capacitance at an acceptable level or higher. This means that the semiconductor device according to the first aspect is able to cope with further integration of the memory cells.

In a preferred embodiment of the semiconductor device according to the first aspect, a fourth electrode is additionally formed on the insulating layer in the vicinity of the opening of the insulating layer. The fourth electrode is electrically connected to the first electrode; and is covered with the dielectric layer. The fourth electrode is opposite to the third electrode through the dielectric layer.

In this case, an additional advantage of an increased capacitance of the storage cell occurs.

In another preferred embodiment of the semiconductor device according to the first aspect, the insulating layer has a two-layer structure including a first insulating sublayer formed in a lower level and a second insulating sublayer formed in an upper level. The opening of the insulating layer is formed by a first opening formed in the first insulating sublayer and a second opening formed in the second insulating sublayer. The second opening is overlapped with the first opening.

The first opening is filled with a conductive plug electrically connected to the first source/drain region. The first and second electrodes are located in the second opening of the second insulating sublayer. The first electrode is electrically connected to the conductive plug.

In this case, an additional advantage that the plan shape of the second opening can be designed as necessary independent of the first opening.

According to a second aspect of the present invention, a fabrication method of the semiconductor device according to the first aspect is provided.

The method is comprised of the following steps:

(a) A transfer transistor is formed in an active region of a semiconductor substrate. The tansistor has first and second source/drain regions in the active region.

(b) An insulating layer is formed on the substrate to cover the transfer transistor.

(c) A penetrating opening is formed in the insulating layer to extend to the first source/drain region. The active region is exposed from the insulating layer in the opening.

(d) A first conductive layer is formed on the insulating layer. The first conductive layer is contacted with the first source/drain region, an inner side face of the opening, and an upper surface of the insulating layer.

(e) A spacer layer is formed on the first conductive layer.

(f) The first conductive layer is selectively removed to form a cylindrical spacer in the opening. The spacer has an opening top and an opening bottom.

(g) A second conductive layer is formed on the first conductive layer to cover the spacer.

(h) The second conductive layer is selectively removed to form a cylindrical second electrode of a storage capacitor in the opening. The second electrode is contacted with the spacer.

(g) The first conductive layer is selectively removed to form a first cylindrical electrode of the capacitor in the opening. The first electrode is concentric with the second electrode and is located in the outside of the second electrode.

(h) The spacer is removed.

(i) A dielectric layer is formed on the insulating layer to cover the first and second electrodes.

(j) A third conductive layer is formed on the dielectric layer. The third conductive layer serves as a third electrode of the capacitor.

With the fabrication method according to the second aspect of the present invention, the semiconductor device according to the first aspect can be fabricated.

According to a third aspect of the present invention, another fabrication method of the semiconductor device according to the second aspect is provided.

The method is comprised of the following steps:

(a) A transfer transistor is formed in an active region of a semiconductor substrate. The tansistor has first and second source/drain regions in the active region.

(b) A first insulating layer is formed on the substrate to cover the transfer transistor.

(c) A first penetrating opening is formed in the first insulating layer to extend to the first source/drain region. The active region is exposed from the first insulating layer in the first opening.

(d) A conductive plug is filled into the first opening to be contacted with the first source/drain region.

(e) A second insulaitng layer is formed on the first insulating layer to cover the conductive plug.

(f) A second penetrating opening is formed in the second insulating layer to extend to the conductive plug.

(g) A first conductive layer is formed on the second insulating layer. The first conductive layer is contacted with the conductive plug through the second opening, an inner side face of the second opening, and an upper surface of the second insulating layer.

(h) A spacer layer is formed on the first conductive layer.

(i) The first conductive layer is selectively removed to form a cylindrical spacer in the second opening. The spacer has an opening top and an opening bottom.

(j) A second conductive layer is formed on the first conductive layer to cover the spacer.

(k) The second conductive layer is selectively removed to form a cylindrical second electrode of a storage capacitor in the second opening. The second electrode is contacted with the spacer.

(l) The first conductive layer is selectively removed to form a first cylindrical electrode of the capacitor in the second opening. The first electrode is is concentric with the second electrode and is located in the outside of the second electrode.

(m) The spacer is removed.

(n) A dielectric layer is formed on the second insulating layer to cover the first and second electrodes.

(o) A third conductive layer is formed on the dielectric layer. The third conductive layer serves as a third electrode of the capacitor.

With the fabrication method according to the third aspect of the present invention, the semiconductor device according to the second aspect can be fabricated.

In a preferred embodiment of the method according to the third aspect, the step (f) of forming the second penetrating opening in the second insulating layer is performed by a dry etching process. The second insulating layer has an etching rate greater than that of the first insulating layer.

In this case, an additional advantage that the exposed first insulating layer in the second opening is surely prevented from being etched during the step (f) occurs.

BRIEF DESCRIPTION OF THE DRAWINGS

In order that the invention may be readily carried into effect, it will now be described with reference to the accompanying drawings .

DETAILED DESCRIPTION OF THE PREFERRED EMBODIMENTS

Figure 1:
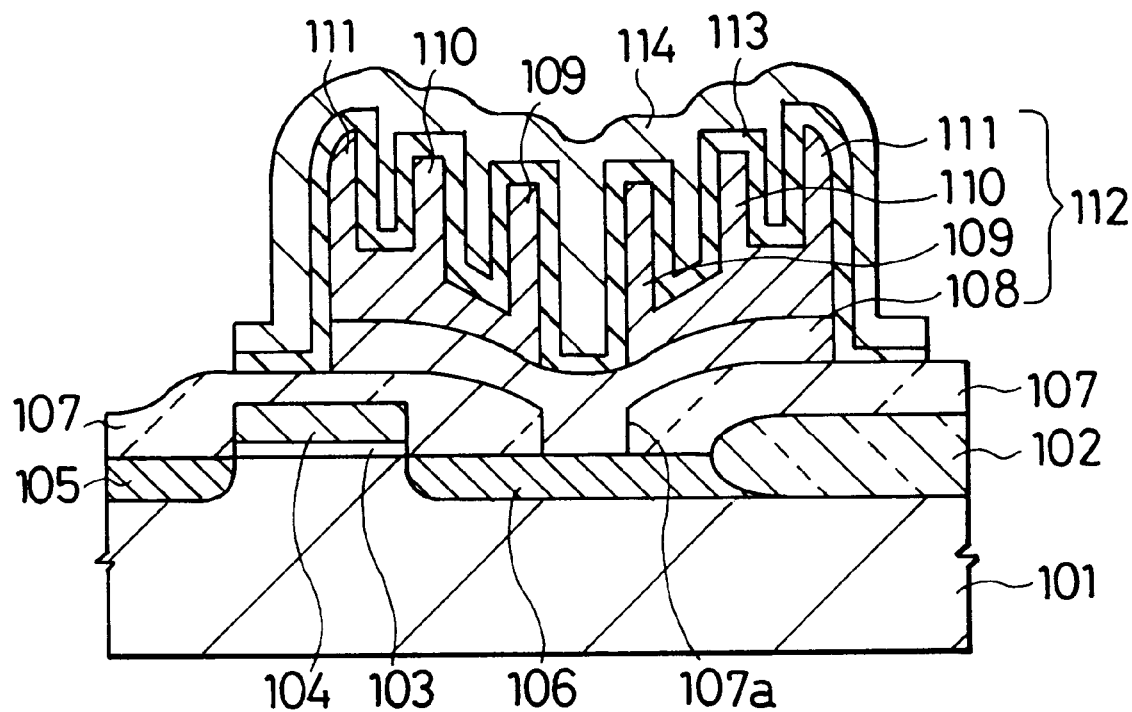
FIG. 1 is a partial, cross-sectional view of a conventional memory cell of a DRAM.

Preferred embodiments of the present invention will be described in detail below while referring to the drawings attached.

FIRST EMBODIMENT

Figure 2:
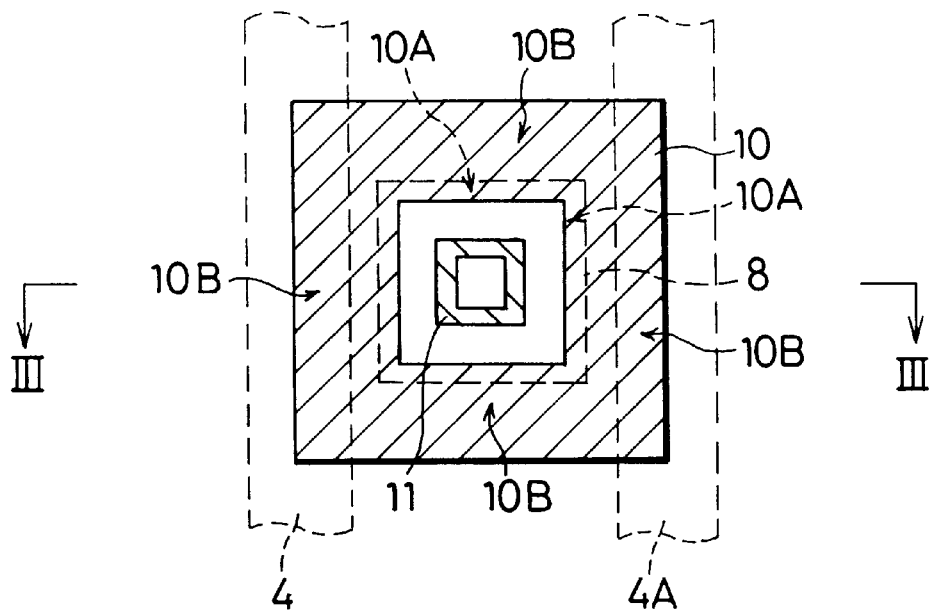
FIG. 2 is a partial, plan view of a memory cell of a DRAM according to a first embodiment of the invention.
Figure 3:
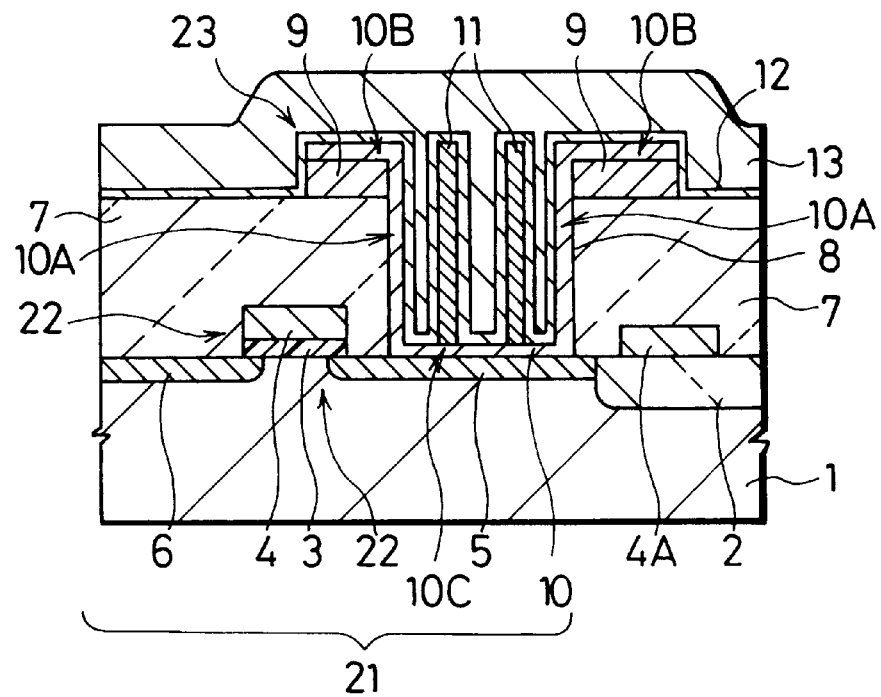
FIG. 3 is a partial cross-sectional view along the line III—III in FIG. 2.

As shown in FIGS. 2 and 3, in a memory cell of a DRAM according to a first embodiment, a field oxide layer 2 is selectively formed on a main surface of a p-type single-crystal silicon substrate 1, defining active regions 21 on the substrate 1. The surface of the substrate 1 is exposed from the field oxide layer 2 in the active regions 21. For the sake of simplification, only one of the active regions 21 thus defined is shown in FIG. 3

In the active region 21, a gate electrode 4 is formed over the substrate 1 on a gate oxide layer 3. A pair of $n^+$-type diffusion regions 5 and 6 are formed in the substrate 1 at each side of the gate electrode 4.

The pair of diffusion regions 5 and 6, the gate oxide layer 3, and the gate electrode 4 constitute a MOSFET 22 serving as a transfer transistor of the memory cell. The pair of diffusion regions 5 and 6 serve as a pair of source/drain regions of the MOSFET, respectively.

A word line 4A is formed on the field oxide layer 2, which is electrically connected to a gate electrode of a transfer transistor of an adjacent memory cell (not shown). The diffusion region 6 connects to a bit line. The gate electrode 4 connects a word line.

An interlayer insulating layer 7 is formed to cover the transfer transistor, the word line 4A, and the field oxide layer 2. The layer 7 has a thickness of approximately 1 μm.

A contact hole 8 is formed in the interlayer insulating layer 7 at a location just over the source/drain region 5. The hole 8 vertically penetrates the layer 7 to extend to the region 5. Here, the shape of the hole 8 is square. However, any other shape such as a rectangle, circle, and so on may be applied to the hole 8.

On the upper surface of the interlayer insulating layer 7, a peripheral electrode 9 is formed in the vicinity of the contact hole 8.

A first electrode 10 is formed in the contact hole B. The first electrode 10 is formed by a square-cylindrical part 10A contacted with the inner wall of the contact hole 8, a square-ring-shaped top part 10B formed on the peripheral electrode 9 outside the hole 8, and a square bottom part 10C formed to be contacted with the underlying source/drain region 5. The part 10C is electrically connected to the source/drain region 5 serving as a storage node.

A second electrode 11 is formed on the square bottom part 10C of the first electrode 10 in the contact hole 8, and is electrically connected to the first electrode 10. The second electrode 11 has square-cylindrical shape, and is concentric with the cylindrical part 10A of the first electrode 10. The second electrode 11 is located in the inside of the cylindrical part 10A.

The combination of the peripheral electrode 9 and the first and second electrodes 10 and 11 constitute a storage electrode of a storage capacitor 23 of the memory cell.

A dielectric layer 12 for the storage capacitor 23 is formed on the interlayer insulating layer 7 to cover the storage electrode.

An upper or plate electrode 13 of the capacitor 23 is formed on the dielectric layer 12.

Thus, the DRAM memory cell according to the first embodiment of FIGS. 2 and 3 includes the single MOS transfer transistor 22 and the single storage capacitor 23 with the twin-cylindrical configuration.

Next, a fabrication method of the DRAM memory cell according to the first embodiment is explained below with reference to FIGS. 4A to 4F.

Figure 4A:
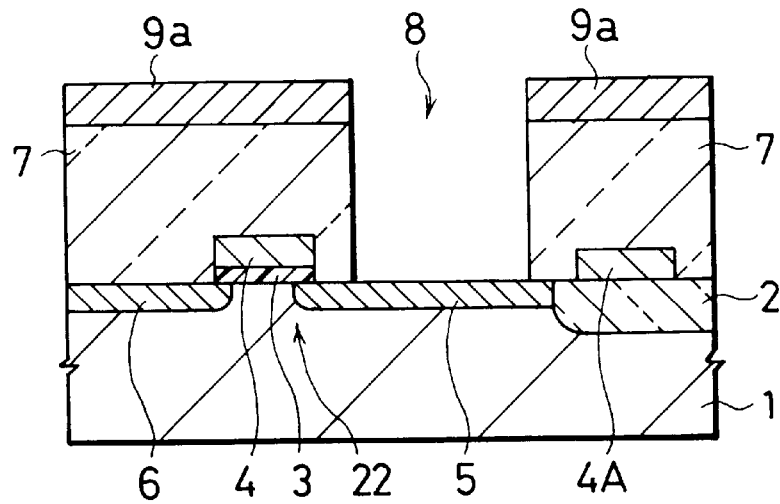
FIGS. 4A to 4F are partial cross-sectional views of the memory cell, which show the fabrication method of the cell according to the first embodiment of FIG. 2, respectively.

First, as shown in FIG. 4A, the field oxide layer 2 is selectively formed on the main surface of the p-type single-crystal silicon substrate 1, thereby defining the active region 21. The layer 2 is formed by a known process such as a trench isolation or recessed Local Oxidation of Silicon (LOCOS) process.

Next, the MOS transfer transistor 22 including the gate oxide layer 3, the gate electrode 4, and the pair of diffusion regions 5 and 6 is formed in the active region 21 by known processes. At the same time, the word line 4A electrically connected to the adjacent MOS transfer transistor is formed on the field oxide layer 2.

The gate oxide layer 3 is formed by a silicon dioxide layer with a thickness of approximately 10 nm. The gate electrode 4 is formed by a titanium polycide layer with a thickness of approximately 200 nm. The source/drain regions 5 and 6 are formed by the n$^+$-type diffusion regions with a thickness of approximately 0.1 $\mu$m, respectively.

Next, the interlayer insulating layer 7 is deposited on the substrate 1 to cover the transfer transistor 22 by a known Chemical Vapor Deposition (CVD) process. To planarize the upper surface of the layer 7, the layer 7 is then polished by a Chemical/Mechanical Polishing process (CMP) until it has a thickness of 1.0 $\mu$m.

Further, a conductive layer 9a is deposited on the planarized interlayer insulating layer 7. The layer 9a is made of a polysilicon layer doped with phosphorus and having a thickness of 200 nm. The layer 9a is formed by a reduced-pressure CVD process using silane (SiH$_4$) and phosphine (PH$_3$) as a reaction gas.

To form the penetrating contact hole 8 in the interlayer insulating layer 7, the conductive layer 9a and the interlayer insulating layer 7 are successively and selectively etched by photplithography and dry etching processes, respectively.

The state at this stage is shown in FIG. 4A.

Figure 4B:
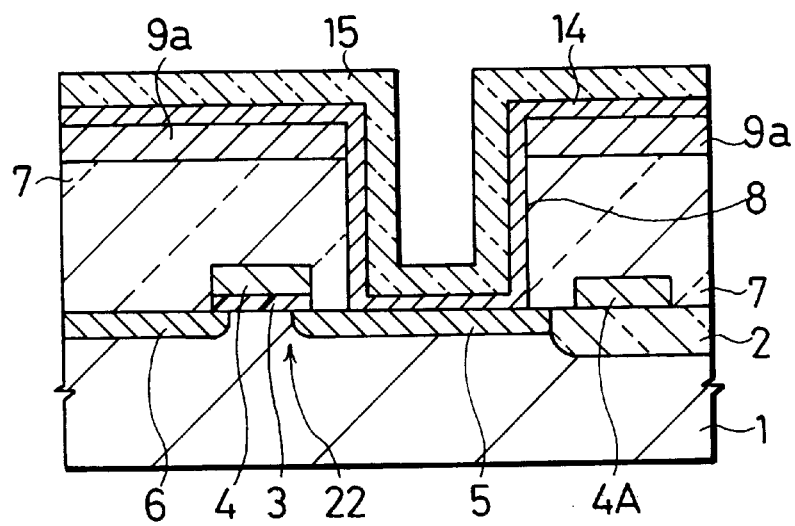

Subsequently, as shown in FIG. 4B, a first conductive layer 14 is formed on the remaining conductive layer 9a. The first conductive layer 14 is contacted with the underlying source/drain region 5, an inner side face of the contact hole 8, and an upper surface of the interlayer insulating layer 7.

The first conductive layer 14 is made of a polysilicon layer doped with phosphorus and having a thickness of 100 nm. The layer 14 is formed by the same CVD process as that of the conductive layer 9a.

A spacer layer 15 is formed on the first conductive layer 14, as shown in FIG. 4B. The layer 15 is a silicon dioxide layer with a thickness of 100 nm. The layer 15 is formed by a reduced-pressure CVD process using silane (SiH$_4$) and nitrous oxide (N$_2$O) as a reaction gas at a temperature of approximately 800° C. The deposited silicon dioxide layer 15 has excellent step coverage.

Figure 4C:
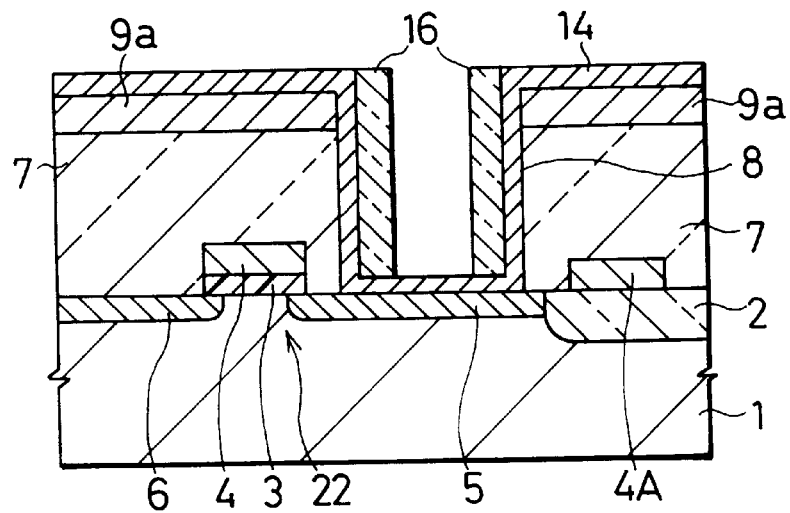

Then, as shown in FIG. 4C, the first conductive layer 15 is selectively etched by an anisotropic, dry etching process, thereby forming a cylindrical spacer 16 with a thickness of aproximately 100 nm in the contact hole 8. The spacer 16 has an opening top and an opening bottom, and is vertically extend along the first conductive layer 14 in the contact hole 8.

This etching process is performed by using a gaseous mixture of CH$_2$F$_2$ and CF$_4$ as an ethcing gas. An obtainable selection ratio of this etching process is approximately 30 to 40. Therefore, the underlying first conductive layer 14 is scarecely etched during this etching process.

The state at this stage is shown in FIG. 4C.

Figure 4D:
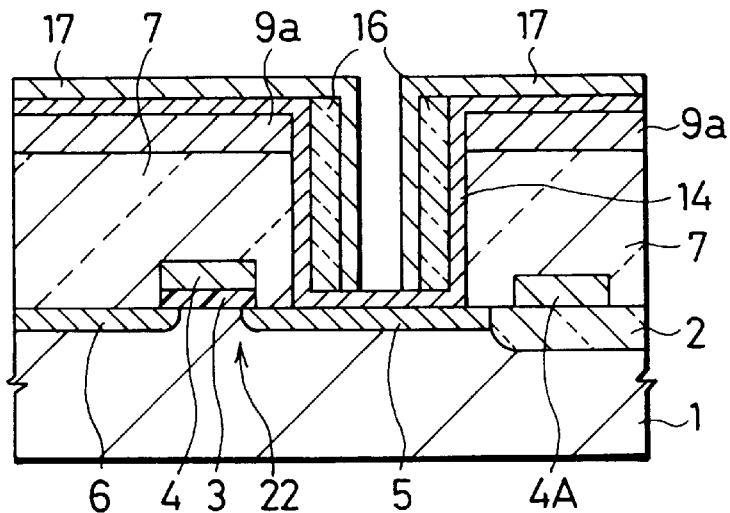

Following this, as shown in FIG. 4D, a second conductive layer 17 is formed on the first conductive layer 14 to cover the spacer 16. The layer 17 is made of a polysilicon layer doped with phosphorus and having a thickness of 100 nm. The layer 17 is formed by a reduced-pressure CVD process under the same condition as that of the first conductive layer 14.

Figure 4E:
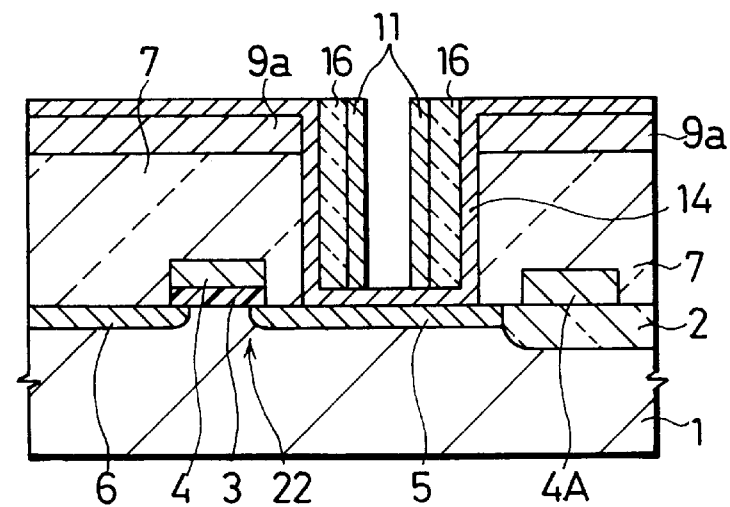

Then, the second conductive layer 17 is selectively etched by an anisotropically dry etching process, thereby forming the cylindrical second electrode 11 in the contact hole 8, as shown in FIG. 4E. This etching process is performed by using a gaseous mixture of Cl$_2$ and HBr as an ethcing gas. An obtainable selection ratio of this etching process is approximately 50. Therefore, the underlying spacer 16 is scarecely etched during this etching process. The second electrode 11 is contacted with the spacer 16. The state at this stage is shown in FIG. 4E.

However, the first conductive layer 14 is located under the second conductive layer 17. Therefore, the etching period needs to be controlled not to be longer than the specific preset period.

Also, the conductive layer 9a is located under the first conductive layer 14 on the interlayer insulating layer 7. Accordingly, even if the etching rate of the dry etching process has a comparatively large fluctuation and as a result, the second conductive layer 17 is excessively etched, at least the conductive layer 9a will always remain on the insulating layer 7.

Further, since the source/drain region 5 is formed in the surface area of the substrate 1, even if a part of the first conductive layer 14 is etched, the electrical connection between the first conductive layer 14 and the source/drain region 5 will always remain unchanged.

Figure 4F:
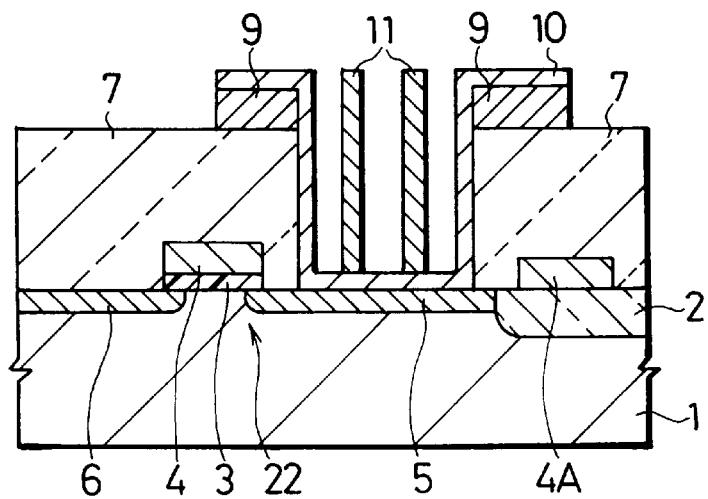

Subsequently, the spacer 16 is selectively etched by a wet etching process using a dilute hydrofluoric acid, as shown in FIG. 4F.

Using photolithography and dry etching processes, the first conductive layer 14 and the conductive layer 9a are selectively etched, thereby forming the first electrode 10 and the peripheral electrode 9, as shown in FIG. 4F. The first electrode 10 is concentric with the second electrode 11 and is located in the contact hole 8, and outside of the second electrode 11. The peripheral electrode 9 is formed on the interlayer insulating layer 7 in the vicinity of the contct hole 8.

As seen from FIG. 4F, the peripheral electrode 9 and the first and second electrodes 10 and 11 are contacted with and electrically connected to each other. The first electrode 10 is electrically connected to the underlying source/drain region 5.

Finally, as shown in FIG. 3, the dielectric layer 12 is formed on the interlayer insulating layer 7 to cover the first and second electrodes 10 and 11. A third conductive layer serving as the third electrode 13 is formed on the dielectric layer 12. The dielectric layer 12 is formed by a silicon nitride layer with a thickness of approximately 6 nm. The third conductive layer 13 is formed by a polysilicon layer doped with phosphorus and having a thickness of 300 nm.

Thus, the DRAM memory cell according to the first embodiment of FIGS. 3 and 4 is obtained.

With the DRAM according to the first embodiment, since the first and second electrodes 10 and 11 serving as the storage electrode of the storage capacitor 23 are formed in the contact hole 8 of the interlayer insulating layer 7, the first and second electrodes 10 and 11 are not damaged and/or broken because of the pressure of a flowing liquid cleaner and others during a subsequent cleaning process.

Also, the second cylindrtical electrode 11 is formed in the hole 8 of the interlayer insulating layer 7 to be concentric with the first electrode 10. The thickness of the first and second electrodes 10 and 11 can be readily reduced. Therefore, the capacitance of the storage capacitor 23 can be designed at an acceptable level or higher even if the miniaturization is further progressed.

Further, the first and second electrodes 10 and 11 are formed to be buried in the interlayer insulating layer 7. Therefore, approximately no height difference is formed between the cell array area and the peripheral circuit area. Thus, the problems relating to the resolution in photolithography process and the breaking and/or short-circuit in interconnecting or wiring metallization process can be solved.

As a result, the DRAM according to the first embodiment is cable of further miniaturization of the storage capacitor 23 while keeping the capacitance at an acceptable level or higher. This means that the DRAM according to the first embodiment is able to cope with further integration of the memory cells.

Because of the peripheral electrode 9, the obtainable capacitance is higher than the case where no peripheral electrode is provided.

SECOND EMBODIMENT

Figure 5:
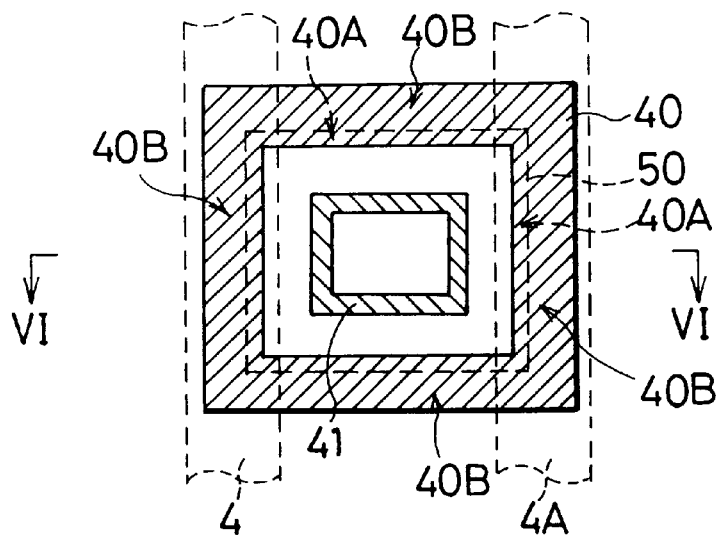
FIG. 5 is a partial, plan view of a memory cell of a DRAM according to a second embodiment of the invention.
Figure 6:
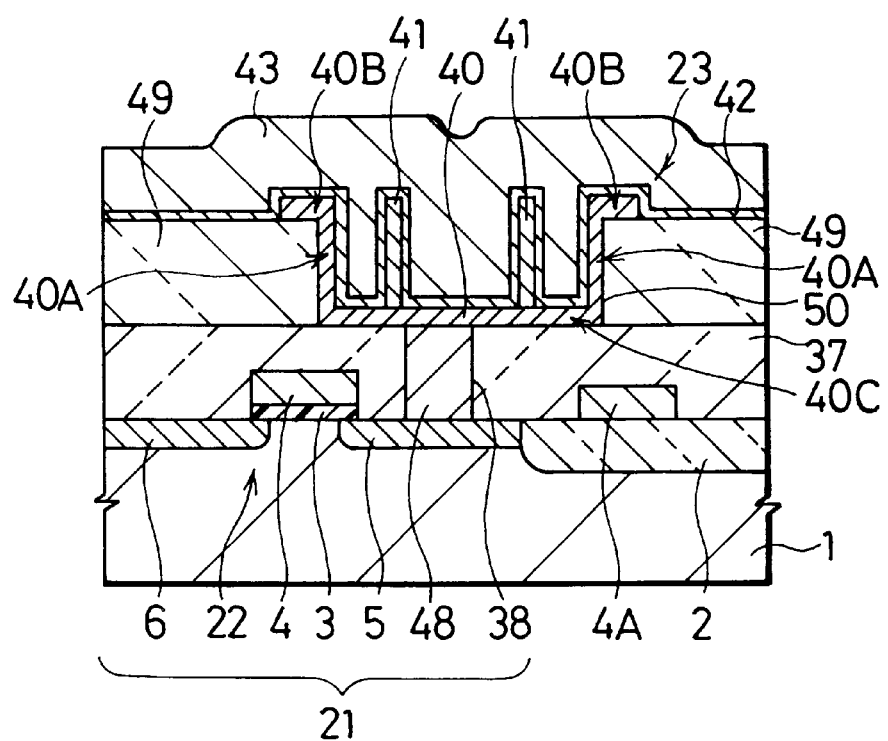
FIG. 6 is a partial cross-sectional view along the line VI—VI in FIG. 5.

A memory cell of a DRAM according to a second embodiment is shown in FIGS. 5 and 6.

As shown in FIGS. 5 and 6, in a memory cell of a DRAM according to the second embodiment, the MOS transfer transistor 22 has the same structure. Therefore, the description relating to the transistor 22 is omitted here by adding the same reference characters to the corresponding elements in FIGS. 5 and 6 for the sake of simplification.

On the surface of the substrate 1, an interlayer insulating layer 37 is formed to cover the transfer transistor 22, the word line 4A, and the field oxide layer 2. The layer 37 has a thickness of approximately 500 nm, which is a half of that of the first embodiment.

A contact hole 38 is formed in the interlayer insulating layer 37 at a location just over the source/drain region 5. The hole 38 vertically penetrates the layer 37 to extend to the region 5. Here, the shape of the hole 48 is circular. However, any other shape such as a rectangle, square, and so on may be applied to the hole 38.

A conductive plug 48 is filled into the contact hole 38 of the interlayer insulating layer 37. The bottom of the plug 48 is contacted with and electrically connected to the source/drain region 5.

An insulating layer 49 is formed on the interlayer insulating layer 37 to cover the plug 48. A contact hole 50 is formed in the insulating layer 49 at a location just over the source/drain region 5 to be overlapped with the underlying contact hole 38 of the interlayer insulating layer 37. The hole 50 vertically penetrates the layer 49 to extend to the plug 48. Here, the shape of the hole 48 is rectangular. However, any other shape such as a circle, square, and so on may be applied to the hole 50.

A first electrode 40 is formed in the contact hole 50. The first electrode 40 is formed by a rectangular-cylindrical part 40A contacted with the inner wall of the contact hole 50, a rectangular-ring-shaped top part 40B formed on the insulating layer 49 outside the hole 50, and a rectangular bottom part 40C formed to be contacted with the underlying plug 48. The part 40C is electrically connected to the source/drain region 5 serving as a storage node through the plug 48.

A second electrode 41 is formed on the rectangular bottom part 40C of the first electrode 40 in the contact hole 50, and is electrically connected to the first electrode 40. The second electrode 41 has rectangular-cylindrical shape, and is concentric with the cylindrical part 40A of the first electrode 40. The second electrode 41 is located in the inside of the cylindrical part 40A.

No peripheral electrode is provided in the second embodiment.

The combination of the first and second electrodes 40 and 41 constitute the storage electrode of the storage capacitor 23 of the memory cell.

A dielectric layer 42 for the storage capacitor 23 is formed on the insulating layer 49 to cover the storage electrode.

An upper or plate electrode 43 of the capacitor 23 is formed on the dielectric layer 42.

Thus, the DRAM memory cell according to the second embodiment of FIGS. 5 and 6 includes the single MOS transfer transistor 22 and the single storage capacitor 23 with the twin-cylindrical configuration.

Next, a fabrication method of the DRAM memory cell according to the second embodiment is explained below with reference to FIGS. 7A to 7F.

Figure 7A:
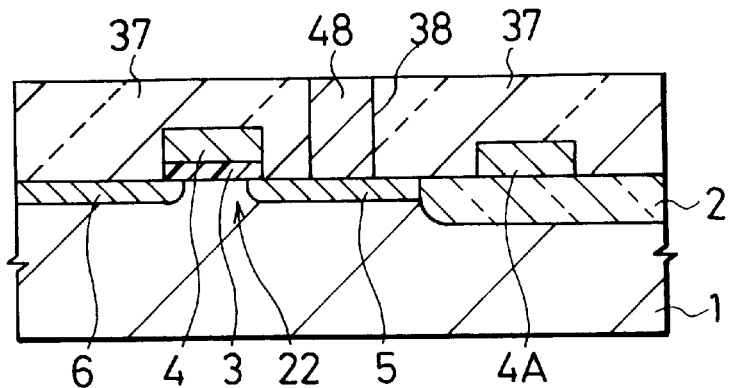
FIGS. 7A to 7F are partial cross-sectional views of the memory cell, which show the fabrication method of the cell according to the second embodiment of FIG. 5, respectively.

First, as shown in FIG. 7A, the field oxide layer 2 is selectively formed on the main surface of the p-type single-crystal silicon substrate 1, thereby defining the active region 21. The layer 2 is formed by a known process such as a trench isolation or recessed LOCOS process.

Next, the MOS transfer transistor 22 including the gate oxide layer 3, the gate electrode 4, and the pair of diffusion regions 5 and 6 is formed in the active region 21 by known processes. At the same time, the word line 4A electrically connected to the adjacent MOS transfer transistor is formed on the field oxide layer 2.

The gate oxide layer 3 is formed by a silicon dioxide layer with a thickness of approximately 8 nm. The gate electrode 4 is formed by a titanium polycide layer with a thickness of approximately 150 nm. The source/drain regions 5 and 6 are formed by the $n^+$-type diffusion regions with a thickness of approximately 0.1 $\mu$m, respectively.

Next, the interlayer insulating layer 37 is deposited on the substrate 1 to cover the transfer transistor 22 by a known CVD process. The layer 37 is formed by a silicon dioxide layer. To planarize the upper surface of the layer 37, the layer 37 is then polished by a CMP process until it has a thickness of approximately 500 nm.

To form the penetrating contact hole 38 in the interlayer insulating layer 37, the interlayer insulating layer 37 is selectively etched by know processes such as photolithography and dry etching processes.

Then, the conductive plug 48 is formed in the contact hole 38 by know processes such as CVD and dry etching processes. The plug 48 is made of a polysilicon doped with phosphorus.

The state at this stage is shown in FIG. 7A.

Further, the insulating layer 49 is deposited on the planarized interlayer insulating layer 37. The layer 49 is made of a phosphor-silicate glass (PSG) layer having a thickness of 1 μm. The layer 49 is formed by a CVD process.

Figure 7B:
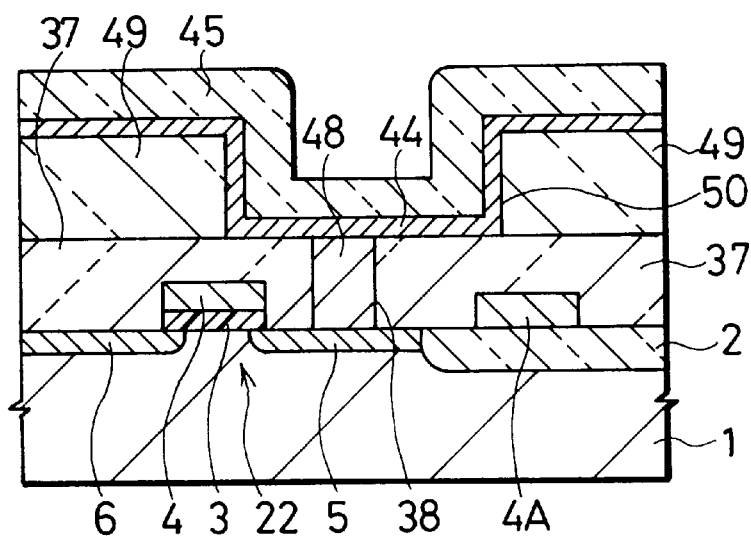

To form the penetrating contact hole 50 in the insulating layer 49, the insulating layer 49 is selectively etched by popular photplithography and dry etching processesas, as shown in FIG. 7B. This etching process needs to be performed in such a way that the underlying interlayer insulating layer 37 is not etched during this process. To cope with this, the etching rate of the insulating layer 49 made of PSG is lower than that of the interlayer insulating layer 37 made of silicon dioxide. Such the dry etching process may be realized by using a gaseous mixture of $CHF_3$, $CF_4$, and CO as an ethcing gas.

Subsequently, as shown in FIG. 7B, a first conductive layer 44 is formed on the insulating layer 49. The first conductive layer 44 is contacted with the underlying plug 48, an inner side face of the contact hole 50, and an upper surface of the insulating layer 49.

The first conductive layer 44 is made of an undoped polysilicon layer having a thickness of 100 nm. The layer 44 is formed by the same CVD process as that of the conductive layer 9a in the first embodiment, except that phosphine is not used.

In the similar way as that of the first embodiment, a spacer layer 45 is formed on the first conductive layer 44, as shown in FIG. 7B. The layer 45 is a silicon dioxide layer with a thickness of 300 nm.

Figure 7C:
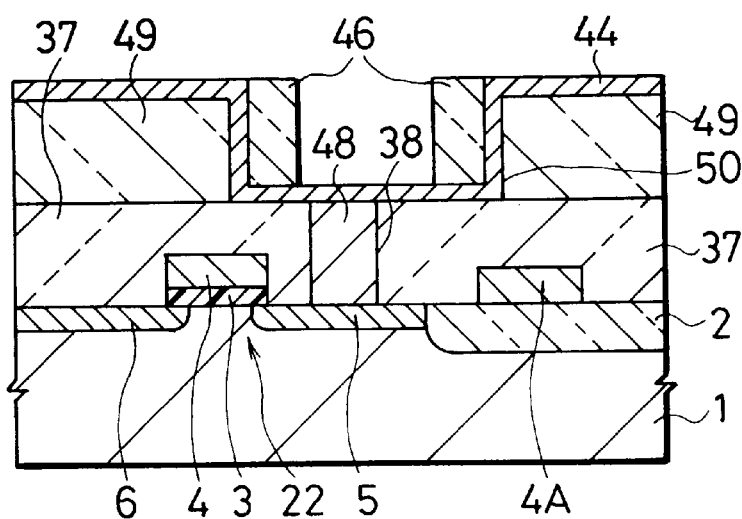

Then, as shown in FIG. 7C, the first conductive layer 45 is selectively etched by an anisotropically dry etching process, thereby forming a cylindrical spacer 46 with a thickness of aproximately 300 nm in the contact hole 50. The spacer 46 has an opening top and an opening bottom, and is vertically extend along the first conductive layer 44 in the contact hole 50.

Figure 7D:
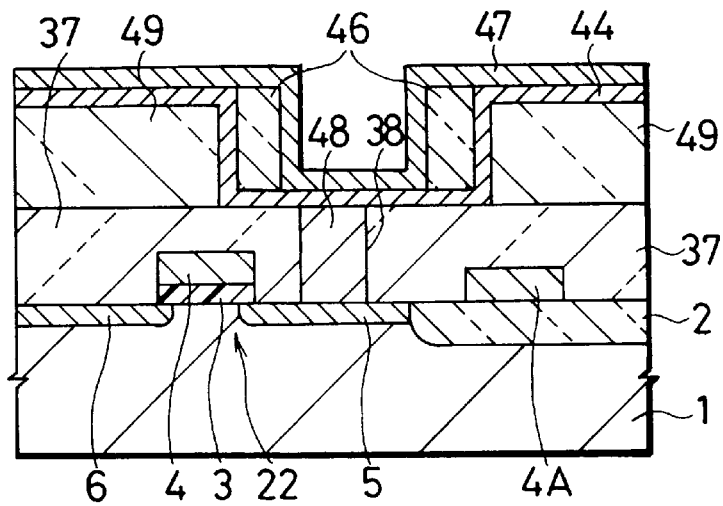

Following this, as shown in FIG. 7D, a second conductive layer 47 is formed on the first conductive layer 44 to cover the spacer 46. The layer 47 is made of a polysilicon layer doped with phosphorus and having a thickness of approximately 100 nm. The layer 47 is formed by a reduced-pressure CVD process under the same condition as that of the first conductive layer 44.

Figure 7E:
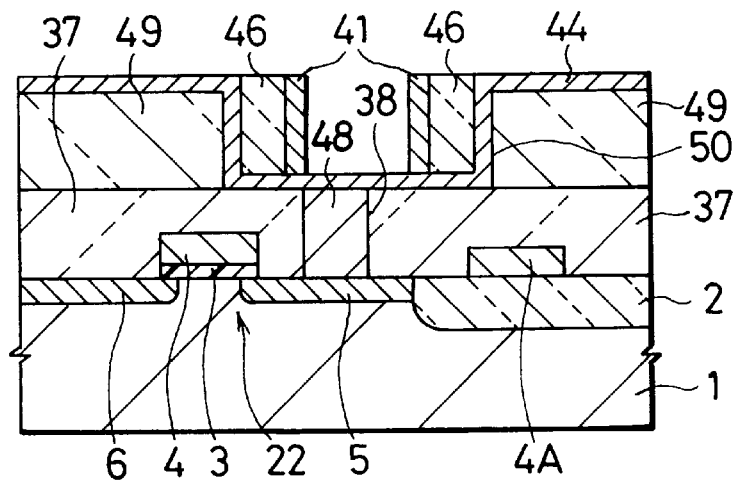

Then, the second conductive layer 47 is selectively etched by an anisotropically dry etching process, thereby forming the cylindrical second electrode 41 in the contact hole 50, as shown in FIG. 7E. This etching process is performed by using a gaseous mixture of $Cl_2$ and HBr as an ethcing gas. Because the etching rate of the first conductive layer 44 is lower than that of the second conductive layer 47, the first conductive layer 46 is scarecely etched during this process. As a result, almost all of the first conductive layer 46 is left even after this process.

The second electrode 41 is contacted with the spacer 16. The state at this stage is shown in FIG. 7E.

Figure 7F:
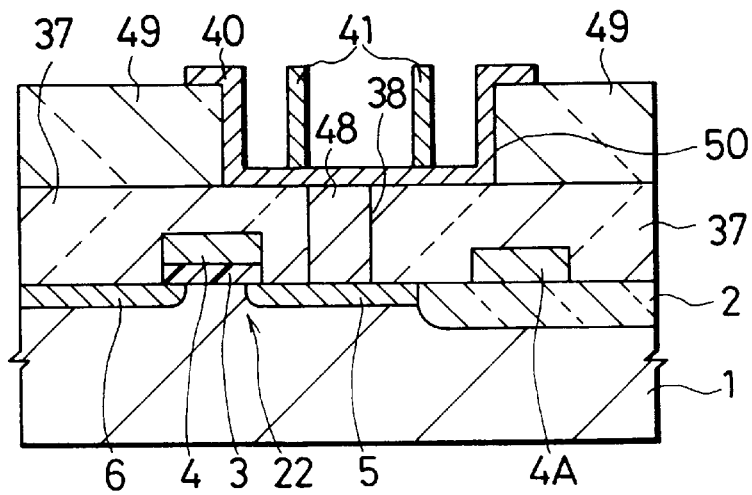

Subsequently, the spacer 46 is selectively etched by a wet etching process using a dilute hydrofluoric acid, as shown in FIG. 7F.

Here, using a thermal diffusion process, the first conductive layer 44 is doped with phosphorus, thereby decreasing the electric resistance of the layer 44.

The first conductive layer 44 is selectively etched by known photolithography and dry etching processes, thereby forming the first electrode 40, as shown in FIG. 7F. The first electrode 40 is concentric with the second electrode 41 and is located in the contact hole 50, and outside of the second electrode 41.

As seen from FIG. 7F, the first and second electrodes 40 and 41 are contacted with and electrically connected to each other. The first electrode 40 is electrically connected to the underlying source/drain region 5 through the conductive plug 48.

Finally, as shown in FIG. 6, the dielectric layer 42 is formed on the insulating layer 49 to cover the first and second electrodes 40 and 41. A third conductive layer serving as the third electrode 43 is formed on the dielectric layer 42. The dielectric layer 42 is formed by a silicon nitride layer with a thickness of approximately 5 nm. The third conductive layer 43 is formed by a polysilicon layer doped with phosphorus and having a thickness of 300 nm.

Thus, the DRAM memory cell according to the second embodiment of FIGS. 5 and 6 is obtained.

With the DRAM according to the second embodiment, since the first and second electrodes 40 and 41 serving as the storage electrode of the storage capacitor 23 are formed in the contact hole 50 of the insulating layer 49, the first and second electrodes 40 and 41 are not damaged and/or broken because of the pressure of a flowing liquid cleaner and others during a subsequent cleaning process.

Also, the second cylindrical electrode 41 is formed in the hole 50 of the insulating layer 49 to be concentric with the first electrode 40. The thickness of the first and second electrodes 40 and 41 can be readily reduced. Therefore, the capacitance of the storage capacitor 23 can be designed at an acceptable level or higher even if the miniaturization is further progressed.

Further, the first and second electrodes 40 and 41 are formed to be buried in the insulating layer 49. Therefore, approximately no height difference is formed between the cell array area and the peripheral circuit area. Thus, the problems relating to the resolution in photolithography process and the breaking and/or short-circuit in interconnecting or wiring metallization process can be solved.

As a result, the DRAM according to the second embodiment is cable of further miniaturization of the storage capacitor 23 while keeping the capacitance at an acceptable level or higher. This means that the DRAM according to the second embodiment is able to cope with further integration of the memory cells.

In this embodiment, there arises an additional advantage that the plan shape of the upper contact hole 50 in the insulating layer 49 can be designed as necessary independent of the lower contact hole 38 in the interlayer insulating layer 37.

As described above, the memory cells according to the first and second embodiments are able to cope with further integration of the memory cells, and they are effectively applicable to the 256-Mbit or 1-Gbit DRAMs.

In the second embodiment, a Boron-doped PSG (BPSG) layer may be used instead of the PSG layer. Further, an insulating layer of any other material may be used if it has a higher etching rate than that of the interlayer insulating layer 37.

Additionally, since the contact hole 50 in the upper insulating layer may be shaped to any rectangle independent of the contact hole 38 in the interlayer insulating layer 37, the plan size of the electrode of the storage capacitor 23 may be designed as necessary according to the wanted size of the memory cell. This means that the storage electrode 23 is capable of arranged on the substrate 1 at a higher density.

In the above first and second embodiments, each of the first and second electrodes is made of a polysilicon doped with phosphorus. However, it is needless to say that they may be formed by any other conductive material such as titanium nitride, a refractory metal (for example, tungsten), and a silicide.

The thickness of the first and second electrodes is set as 100 nm in the both embodiments described above. However, because of the inventor's test, it was found that the thickness was able to be decreased to a value as thin as approximately 20 nm.

Further, in the above first and second embodiments, the first and second electrodes constitute a twin-cylindrical configuration. However, it is clear that any other cylindrical configuration including three, four, or more cylinders may be applied to the invention.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device with a memory cell having a transfer transistor and a storage capacitor, said device comprising:
    (a) a semiconductor substrate;
    (b) an active region formed in a surface area of said substrate;
    said transfer transistor being formed in said active region;
    said transistor having first and second source/drain regions formed in said active region and a gate electrode formed over a channel region between said first and second source/drain regions;
    (c) an insulating layer formed on the surface area of said substrate to cover said active region and in contact with a top surface and side surfaces of said gate electrode;
    said insulating layer having a penetrating opening extending to said first source/drain region;
    (d) a first cylindrical electrode formed in said opening of said insulating layer to be electrically connected to said first source/drain region;
    (e) a second cylindrical electrode formed in said opening of said insulating layer in an inside of said first electrode to be concentric with said first electrode;
    (f) a dielectric layer formed on said insulating layer to cover a surface of said first and second electrodes; and
    (g) a third electrode formed on said dielectric to be opposite to said first and second electrodes through said dielectric layer;
    wherein said first and second electrodes constitute a storage electrode of said storage capacitor;
    and wherein said third electrode constitutes a plate electrode of said storage capacitor.

2. A device as claimed in claim 1, further comprising a fourth electrode formed on said insulating layer in a vicinity of said opening of said insulating layer;
    wherein said fourth electrode is electrically connected to said first electrode, and is covered with said dielectric layer;
    and wherein said fourth electrode is opposite to said third electrode through said dielectric layer.

3. A device as claimed in claim 1, wherein said insulating layer has a two-layer structure including a first insulating sublayer having a substantially planar top surface and formed in a lower level, and a second insulating sublayer having a substantially planar top surface and formed in an upper level;
    and wherein said opening of said insulating layer is formed by a first opening formed in said first insulating sublayer and a second opening formed in said second insulating sublayer;
    and wherein second opening is overlapped with said first opening;
    and wherein said first opening is filled with a conductive plug electrically connected to said first source/drain region;
    and wherein said first and second electrodes are located in said second opening of said second insulating sublayer;
    and wherein said first electrode is electrically connected to said conductive plug;
    and wherein said third electrode is said plate electrode which extends over said substantially planar top surface of said second insulating sublayer and on said dielectric layer to interconnect adjacent storage capacitor third electrodes.

4. A memory cell, comprising:
    a transfer transistor having first and second source/drain regions and a gate electrode formed over a channel region between said first and second source/drain regions on a semiconductor substrate;
    an insulating layer formed over said transfer transistor and said gate electrode, said insulating layer having a penetrating opening extending to said first source/drain region, said insulating layer being in contact with a top surface and side surfaces of said gate electrode; and
    a storage capacitor comprising:
        a first cylindrical electrode having an approximate thickness of between 20 nm and 100 nm and formed in said opening of said insulating layer to be electrically connected to said first source/drain region;
        a second cylindrical electrode connected to said first electrode, having an approximate thickness of between 20 nm and 100 nm, and formed in said opening of said insulating layer in an inside of said first electrode to be concentric with said first electrode;
        a dielectric layer formed on said insulating layer and said first and second electrodes; and
        a third electrode formed on said dielectric to be opposite to said first and second electrodes through said dielectric layer.

5. A memory cell as claimed in claim 4, wherein said first and second cylindrical electrodes constitute a storage electrode of said storage capacitor and said third electrode constitutes a plate electrode of said storage capacitor.

6. A device as claimed in claim 5, further comprising a fourth electrode formed on said insulating layer in a vicinity of said opening of said insulating layer;
    wherein said fourth electrode is electrically connected to said first electrode, and is covered with said dielectric layer;

and wherein said fourth electrode is opposite to said third electrode through said dielectric layer.

7. A memory cell as claimed in claim 4, wherein said first and second cylindrical electrodes constitute a storage electrode of said storage capacitor and said third electrode constitutes a plate electrode of said storage capacitor.

8. A memory cell as claimed in claim 7, whereby a height of said memory cell array area and a peripheral circuit area have approximately the same height and wiring metallization defects are eliminated.

9. A memory cell as claimed in claim 8, wherein said insulating layer is in contact with a top surface and side surfaces of said gate electrode.

10. A memory cell as claimed in claim 9, wherein said storage electrode is comprised of more than two cylindrical electrodes.

11. A memory cell, comprising:
- a transfer transistor having first and second source/drain regions and a gate electrode formed over a channel region between said first and second source/drain regions on a semiconductor substrate;
- a word line adjacent said transfer transistor and formed over an isolation region on said semiconductor substrate;
- an insulating layer comprised of a two-layer structure, including a first insulating sublayer formed in a lower level and a second insulating sublayer formed in an upper level, and formed over said transfer transistor, said gate electrode, and said word line, said insulating layer having a penetrating opening extending to said first source/drain region; and
- a storage capacitor comprising:
  - a first cylindrical electrode formed in said opening of said insulating layer to be electrically connected to said first source/drain region;
  - a second cylindrical electrode connected to said first electrode formed in said opening of said insulating layer in an inside of said first electrode to be concentric with said first electrode;
  - a dielectric layer formed on said insulating layer and said first and second electrodes; and
  - a third electrode formed on said dielectric to be opposite to said first and second electrodes through said dielectric layer, wherein said first insulating sublayer has a substantially planar top surface except where contact holes and said penetrating openings are formed, so as to form a memory device with a height of said memory cell array area and a peripheral circuit area having approximately the same height.

12. A memory cell as claimed in claim 11, wherein said first and second cylindrical electrodes have an approximate thickness of between 20 nm and 100 nm.

13. A memory cell as claimed in claim 12, wherein said first and second cylindrical electrodes constitute a storage electrode of said storage capacitor and said third electrode constitutes a plate electrode of said storage capacitor.

14. A memory cell as claimed in claim 13, wherein said first insulating sublayer has an approximate thickness of 500 nm.

15. A memory cell as claimed in claim 14, wherein said second insulating sublayer has an approximate thickness of 1 um.

16. A memory cell as claimed in claim 15, whereby wiring metallization defects are eliminated.

17. A memory cell as claimed in claim 16, wherein said insulating layer is in contact with a top surface and side surfaces of said gate electrode.

18. A memory cell as claimed in claim 11, wherein said insulating layer is in contact with a top surface and side surfaces of said gate electrode.

* * * * *

UNITED STATES PATENT AND TRADEMARK OFFICE
CERTIFICATE OF CORRECTION

PATENT NO. : 6,104,055
DATED : August 15, 2000
INVENTOR(S) : Kenji Watanabe

It is certified that error appears in the above-identified patent and that said Letters Patent is hereby corrected as shown below:

Column 6, line 58, delete "B" insert --8--.

Signed and Sealed this

Eighth Day of May, 2001

Attest:

NICHOLAS P. GODICI

Attesting Officer

Acting Director of the United States Patent and Trademark Office